United States Patent
Hung et al.

(10) Patent No.: US 9,722,832 B1
(45) Date of Patent: Aug. 1, 2017

(54) FREQUENCY CONTROL CIRCUIT, FREQUENCY CONTROL METHOD AND PHASE LOCKED LOOP CIRCUIT

(71) Applicant: HIMAX TECHNOLOGIES LIMITED, Tainan (TW)

(72) Inventors: Shih-Che Hung, Tainan (TW); Chun-Liang Chen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 15/191,509

(22) Filed: Jun. 23, 2016

(51) Int. Cl.
*H04L 27/152* (2006.01)
*H04L 7/033* (2006.01)

(52) U.S. Cl.
CPC .......... *H04L 27/152* (2013.01); *H04L 7/0331* (2013.01)

(58) Field of Classification Search
USPC .............. 375/374; 327/156, 157; 331/16, 11
See application file for complete search history.

(56) References Cited

U.S. PATENT DOCUMENTS

| | | | | |
|---|---|---|---|---|
| 6,147,530 A * | 11/2000 | Nogawa | ................... | H03L 7/07 327/107 |
| 6,680,887 B2 | 1/2004 | Shihara | | |
| 9,237,004 B2 | 1/2016 | Lin | | |
| 2004/0201428 A1* | 10/2004 | Kenney | ................... | H03L 7/107 331/16 |
| 2006/0226916 A1* | 10/2006 | Florescu | ............... | H03L 7/0898 331/16 |
| 2008/0100385 A1 | 5/2008 | Lin | | |
| 2012/0062291 A1* | 3/2012 | Saitoh | ..................... | H04L 7/033 327/157 |
| 2012/0139593 A1* | 6/2012 | Saito | ....................... | H03L 7/087 327/156 |
| 2013/0108001 A1* | 5/2013 | Chang | ..................... | H04L 7/033 375/374 |

* cited by examiner

*Primary Examiner* — Eva Puente
(74) *Attorney, Agent, or Firm* — CKC & Partners Co., Ltd.

(57) ABSTRACT

A frequency control circuit, adapted to be utilized in a phase locked loop circuit. The frequency control circuit includes a first frequency control block, a second frequency control block, a pump control unit and a charge pump unit. The first frequency control block generates a first control signal according to a frequency of an output signal from the phase locked loop circuit, in which the first control signal is configured to control the frequency of the output signal located within a predetermined frequency region. The second frequency control block generates a second control signal according to a frequency of an input signal and the frequency of the output signal, in which the second control signal is configured to control the frequency of the output signal located at a target frequency.

14 Claims, 8 Drawing Sheets

S410 generating a first control signal according to a frequency of an output signal from the phase locked loop circuit, in which the first control signal is configured to control the frequency of the output signal located within a predetermined frequency region

S420 generating a second control signal according to a frequency of an input signal and the frequency of the output signal, in which the second control signal is configured to control the frequency of the output signal located at a predetermined frequency

S430 generating a raise-up signal or a pull-down signal according to the first control signal and the second control signal

S440 generating a control current for raising up the frequency of the output signal according to the raise-up signal or pulling down the frequency of the output signal according to the pull-down signal

Fig. 4

FREQUENCY CONTROL CIRCUIT, FREQUENCY CONTROL METHOD AND PHASE LOCKED LOOP CIRCUIT

BACKGROUND

Technical Field

The present disclosure relates to a frequency control circuit, a frequency control method and a phase locked loop circuit. More particularly, the present disclosure relates to a frequency control circuit, which does not need to utilize additional clock signals for controlling the frequency of the output signal, and a frequency control method and a phase locked loop circuit.

Description of Related Art

A phase locked loop circuit (PLL) is a control system that utilizes a negative feedback to generate an output signal, which is phase-locked to an input signal. The phase locked loop circuit is widely used in a variety of applications, such as synthesizing a stable frequency or recovering a signal from a communication channel.

Phase locked loop has been widely used in communication system to perform clock and data recovery. Generally, the phase locked loop circuit needs to have an additional clock signal for a frequency tracking loop thereof, and the additional clock signal can be received from a transmitter or created by a on chip high accuracy reference clock generator. The clock reference that from transmitter needs to have another channel; on chip high accuracy reference clock generator usually suffer from high power consumption. Extract the frequency information directly from random data stream is another way to provide frequency locked in PLL. However, there are ISI jitters commonly existed due to the channel loss in the random data input signal. Therefore, how to prevent the jitters of the input signal from affecting the operation of the phase locked loop circuit is also an important issue.

SUMMARY

The following presents a simplified summary of the disclosure in order to provide a basic understanding to the reader. This summary is not an extensive overview of the disclosure and it does not identify key/critical components of the present disclosure or delineate the scope of the present disclosure. Its sole purpose is to present some concepts disclosed herein in a simplified form as a prelude to the more detailed description that is presented later.

In one aspect, the present disclosure is to provide a frequency control circuit. The frequency control circuit is adapted to be utilized in a phase locked loop circuit. The frequency control circuit includes a first frequency control block, a second frequency control block, a pump control unit and a charge pump unit. The first frequency control block is configured to generate a first control signal according to a frequency of an output signal from the phase locked loop circuit, in which the first control signal is configured to control the frequency of the output signal located within a predetermined frequency region. The second frequency control block is configured to generate a second control signal according to a frequency of an input signal and the frequency of the output signal, in which the second control signal is configured to control the frequency of the output signal located at a target frequency. The pump control unit electrically coupled with the first frequency control block and the second frequency control block is configured to generate a raise-up signal or a pull-down signal according to the first control signal and the second control signal. The charge pump unit electrically coupled with the pump control unit is configured to generate a control current for raising up the frequency of the output signal according to the raise-up signal or pulling down the frequency of the output signal according to the pull-down signal.

In another aspect, the present disclosure is to provide a frequency control method adapted to be utilized in a phase locked loop circuit. The frequency control method includes the following steps: generating a first control signal according to a frequency of an output signal from the phase locked loop circuit, in which the first control signal is configured to control the frequency of the output signal located within a predetermined frequency region; generating a second control signal according to a frequency of an input signal and the frequency of the output signal, in which the second control signal is configured to control the frequency of the output signal located at a target frequency; generating a raise-up signal or a pull-down signal according to the first control signal and the second control signal; and generating a control current for raising up the frequency of the output signal according to the raise-up signal or pulling down the frequency of the output signal according to the pull-down signal.

In still another aspect, the present disclosure is to provide a phase locked loop circuit. The phase locked loop circuit includes a voltage-controlled oscillator, a phase control circuit and a frequency control circuit. The voltage-controlled oscillator is configured to generate an output signal. The phase control circuit electrically coupled with the voltage-controlled oscillator is configured to generate a first control current according to a phase of an input signal and a phase of the output signal. The frequency control circuit electrically coupled with the voltage-controlled oscillator is configured to generate a second control current according to a frequency of the input signal and the frequency of the output signal, in which the frequency control circuit includes a first frequency control block, a second frequency control block, a pump control unit and a charge pump unit. The first frequency control block is configured to generate a first control signal according to the frequency of the output signal, in which the first control signal is configured to control the frequency of the output signal located within a predetermined frequency region. The second frequency control block is configured to generate a second control signal according to the frequency of the input signal and the frequency of the output signal, in which the second control signal is configured to control the frequency of the output signal located at a target frequency. The pump control unit electrically coupled with the first frequency control block and the second frequency control block is configured to generate a raise-up signal or a pull-down signal according to the first control signal and the second control signal. The charge pump unit electrically coupled with the pump control unit is configured to generate the second control current for raising up the frequency of the output signal according to the raise-up signal or pulling down the frequency of the output signal according to the pull-down signal.

By applying the techniques disclosed in the present disclosure, there is no additional clock signal should be utilized, and thus costs of phase lock circuits can be decreased. In addition, in some embodiments, controlling the frequency detecting unit effectively prevents the jitters of the input signal from affecting the operation of the phase locked loop circuit, or in some embodiments, the frequency detecting unit can be turned off to reduce the power consumption.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Figure 1:
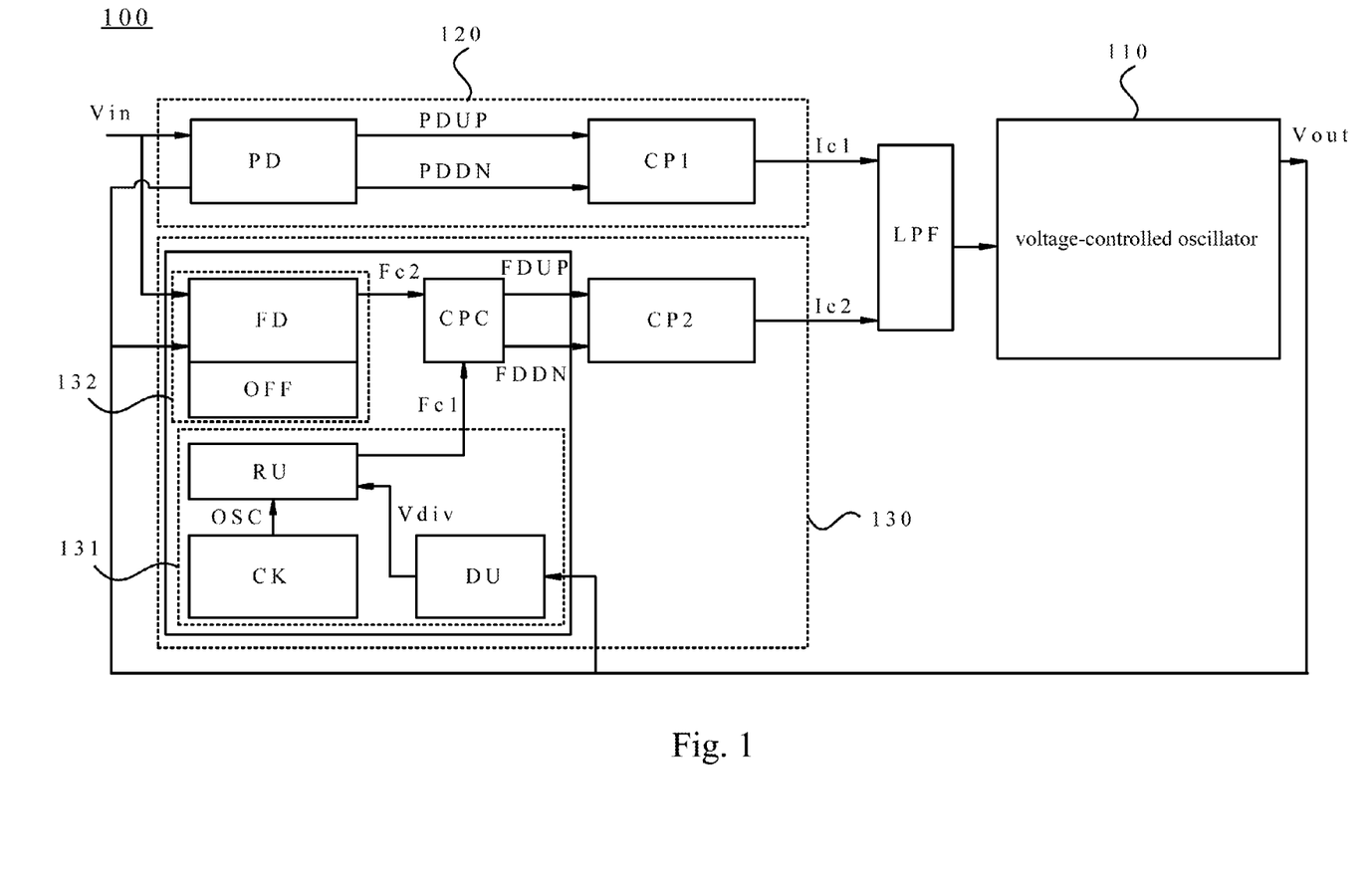
FIG. 1 is a schematic diagram of a phase lock loop circuit in accordance with one embodiment of the present disclosure.

Reference is made first to FIG. 1. FIG. 1 is a schematic diagram of a phase lock loop circuit 100 in accordance with one embodiment of the present disclosure. The phase lock loop circuit 100 can be utilized in communication systems, but the phase lock loop circuit 100 can also be utilized in many other applications that need to lock phases and frequencies, and the present disclosure is not limited in this regard. The phase lock loop circuit 100 includes a voltage-controlled oscillator 110, a phase control circuit 120 and a frequency control circuit 130.

As shown in FIG. 1, the voltage-controlled oscillator 110 is configured to generate an output signal Vout. The phase control circuit 120 electrically coupled with the voltage-controlled oscillator 130 is configured to generate a first control current Ic1 according to a phase of an input signal Vin and a phase of the output signal Vout. The frequency control circuit 130 electrically coupled with the voltage-controlled oscillator 110 is configured to generate a second control current Ic2 according to a frequency of the input signal Vin and the frequency of the output signal Vout. That is to say, in the embodiment, the phase control circuit 120 can be regarded as a phase tracking loop, and the first control current Ic1 is utilized for making the phase of the output signal Vout to be the same with the phase of the input signal Vin. On the other hand, the frequency control circuit 130 can be regarded as a frequency tracking loop, and the second control current Ic2 is utilized for making the frequency of the output signal Vout to be the same with the frequency of the input signal Vin.

For further explanation, the phase control circuit 120 includes a phase detecting unit PD and a charge pump unit CP1. The phase detecting unit PD compares the phase of the output signal Vout with the phase of the input signal Vin, and then generates a raise-up signal PDUP or a pull-down signal PDDN according to a result of the comparison. For example, if the phase of the output signal Vout leads the phase of the input signal Vin, the phase detecting unit PD generates the pull-down signal PDDN for charge pump unit CP1 to decrease the first control current Ic1, or if the phase of the output signal Vout lags the phase of the input signal Vin, the phase detecting unit PD generates the raise-up signal PDUP for charge pump unit CP1 to decrease the first control current Ic1.

The frequency control circuit 130 includes a first frequency control block 131, a second frequency control block 132, a pump control unit CPC and a charge pump unit CP2. The first frequency control block 131 is configured to generate a first control signal Fc1 according to the frequency of the output signal Vout, in which the first control signal Fc1 is configured to control the frequency of the output signal Vout located within a predetermined frequency region. The second frequency control block 132 is configured to generate a second control signal Fc2 according to the frequency of the input signal Vin and the frequency of the output signal Vout, in which the second control signal Fc2 is configured to control the frequency of the output signal Vout located at a target frequency. The pump control unit CPC electrically coupled with the first frequency control block 131 and the second frequency control block 132 is configured to generate a raise-up signal FDUP or a pull-down signal FDDN according to the first control signal Fc1 and the second control signal Fc2. The charge pump unit CP2 electrically coupled with the pump control unit CPC is configured to generate the second control current Ic2 for raising up the frequency of the output signal Vout according to the raise-up signal FDUP or pulling down the frequency of the output signal according to the pull-down signal FDDN.

For further explanation, in this embodiment, the first frequency control block 131 can be regarded as a coarse tune controller, which is utilized to control the frequency of the output signal Vout located within the predetermined frequency region, and then the second frequency control block 132 can be regarded as a fine tune controller, which is utilized to control the frequency of the output signal Vout further located at the target frequency. Therefore, the first frequency control block 131 and the second frequency control block 132 can make the frequency of the output signal Vout to be accurately the same with the frequency of the input signal Vin. As shown in FIG. 1, a raise-up signal FDUP and a pull-down signal FDDN are generated by the pump control unit CPC to the charge pump unit CP2 for charging/discharging a low-pass filter LPF. Furthermore, the charge pump unit CP1 and the charge pump unit CP2 are electrically coupled with the low-pass filter LPF, and the low-pass filter LPF is electrically coupled with the voltage-controlled oscillator 110. For example, if the predetermined frequency is 1 GHz and a frequency deviation of 5% is assumed, then the predetermined frequency region is 0.95 GHz~1.05 GHz. Therefore, if the frequency of the output signal Vout is not located within 0.95 GHz~1.05 GHz, such as 1.2 GHz, the first control signal Fc1 is generated to the pump control unit CPC, and the pull-down signal FDDN is generated to the charge pump unit CP2 for decreasing the second control current Ic2, and thus pulling down the frequency of the output signal Vout. In this manner, if the frequency of the output signal Vout is lower than 0.95 GHz, such as 0.8 GHZ, the first control signal Fc1 is generated to the pump control unit CPC, and the raise-up signal FDUP is generated to the charge pump unit CP2 for increasing the second control current Ic2, and thus raising up the frequency of the output signal Vout. It should be noted that the abovementioned values are just for explanation and can be replaced by any other values, and the present disclosure is not limited in this regard.

In some embodiments, the first frequency control block 131 includes clock generating unit CK, a frequency dividing unit DU and a rotating unit RU. The clock generating unit CK is configured to generate a clock signal OSC, and the frequency of the clock signal OSC is shown as Fosc. For example, if the frequency of the clock signal Fosc is 10 MHz and a factor N is 100, then the predetermined frequency which equals to the frequency of the clock signal Fosc times the factor N is 1 GHz. The frequency dividing unit DU is configured to divide the frequency of the output signal Vout by a factor N to generate a frequency-divided signal Vdiv. The rotating unit RU electrically coupled with the frequency dividing unit DU and the clock generating unit CK is configured to generate the first control signal Fc1 while a difference between a frequency of the frequency-divided signal Vdiv and a frequency of the clock signal OSC is bigger than a predetermined value corresponding to the predetermined frequency region.

In this embodiment, the clock generating unit CK can be any kind of clock generator without high accuracy such as a low power RC oscillator. For example, if the accuracy allowance of the low power RC oscillator is plus-minus 3 percent, the target frequency can be ensured in the predetermined frequency region when the predetermined frequency region is a region between two values which have 3 percent more and less than the predetermined frequency respectively. However, for communication application, the frequency of the output signal Vout (~GHz) may be much higher than the frequency of the clock signal OSC. Therefore, the frequency dividing unit DU divides the frequency of the output signal Vout by the factor N to obtain the frequency-divided signal Vdiv, whose frequency is much closer to the frequency of the clock signal OSC. For example, if the clock signal OSC is 10 MHz, and the frequency of the output signal Vout is 1.2 GHz and the factor N is 100, then the frequency-divided signal Vdiv having the frequency of 12 MHz is obtained. Thus, the rotating unit RU can further obtain the difference between the frequency of the frequency-divided signal Vdiv and the frequency of the clock signal OSC, such as 2 MHz. As stated above, if the predetermined frequency region of the output signal Vout is 0.95 GHz~1.05 GHz, and 1.2 GHz is not located within the predetermined frequency region, and in this embodiment, the rotating unit RU may determine whether the frequency-divided signal Vdiv is located within (0.95 GHz~1.05 GHz)/100=(9.5 MHz~10.5 MHz). That is to say, the rotating unit RU determines whether the difference 2 MHz is bigger than 0.5 MHz. As a result, 12 MHz is not located within 9.5 MHz~10.5 MHz (or 2 MHz is bigger than 0.5 MHz), and thus the rotating unit RU may generate the first control signal Fc1 to the pump control unit CPC for pulling down the frequency of the output signal Vout. Similarly, the abovementioned values are just for explanation and can be replaced by any other values, and the present disclosure is not limited in this regard.

Reference is still made to FIG. 1, the second frequency control block 132 includes a frequency detecting unit FD. The frequency detecting unit FD is configured to generate a detect signal Vd according to the frequency of the output signal Vout, and extract the amount of frequency deviation between the output signal Vout and the input signal Vin from the time duration of the input signal consecutive dots located in out-phase regions.

Figure 2A:
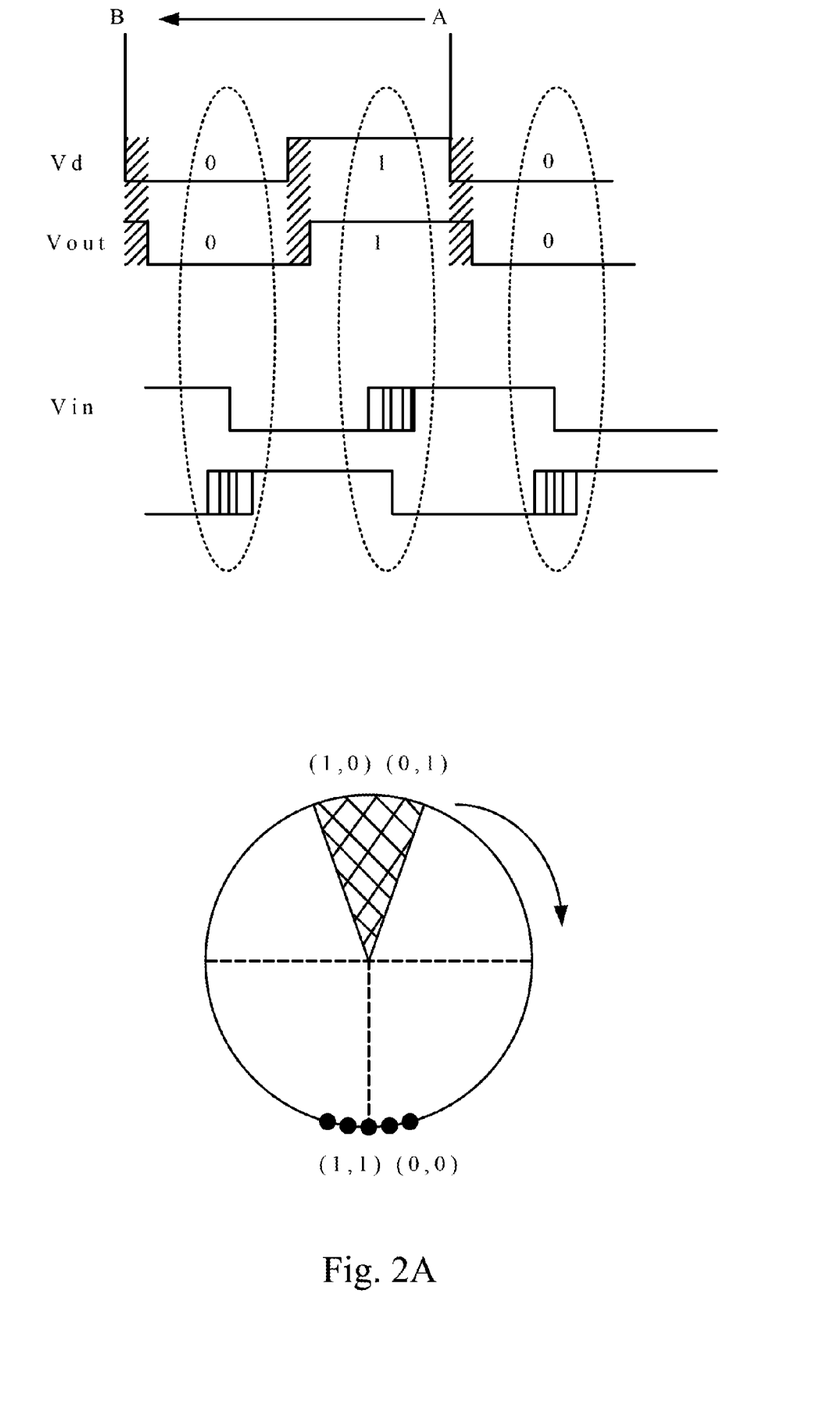
FIG. 2A is a schematic diagram of the detecting principle of the frequency detecting unit in accordance with one embodiments of the present disclosure.
Figure 2B:
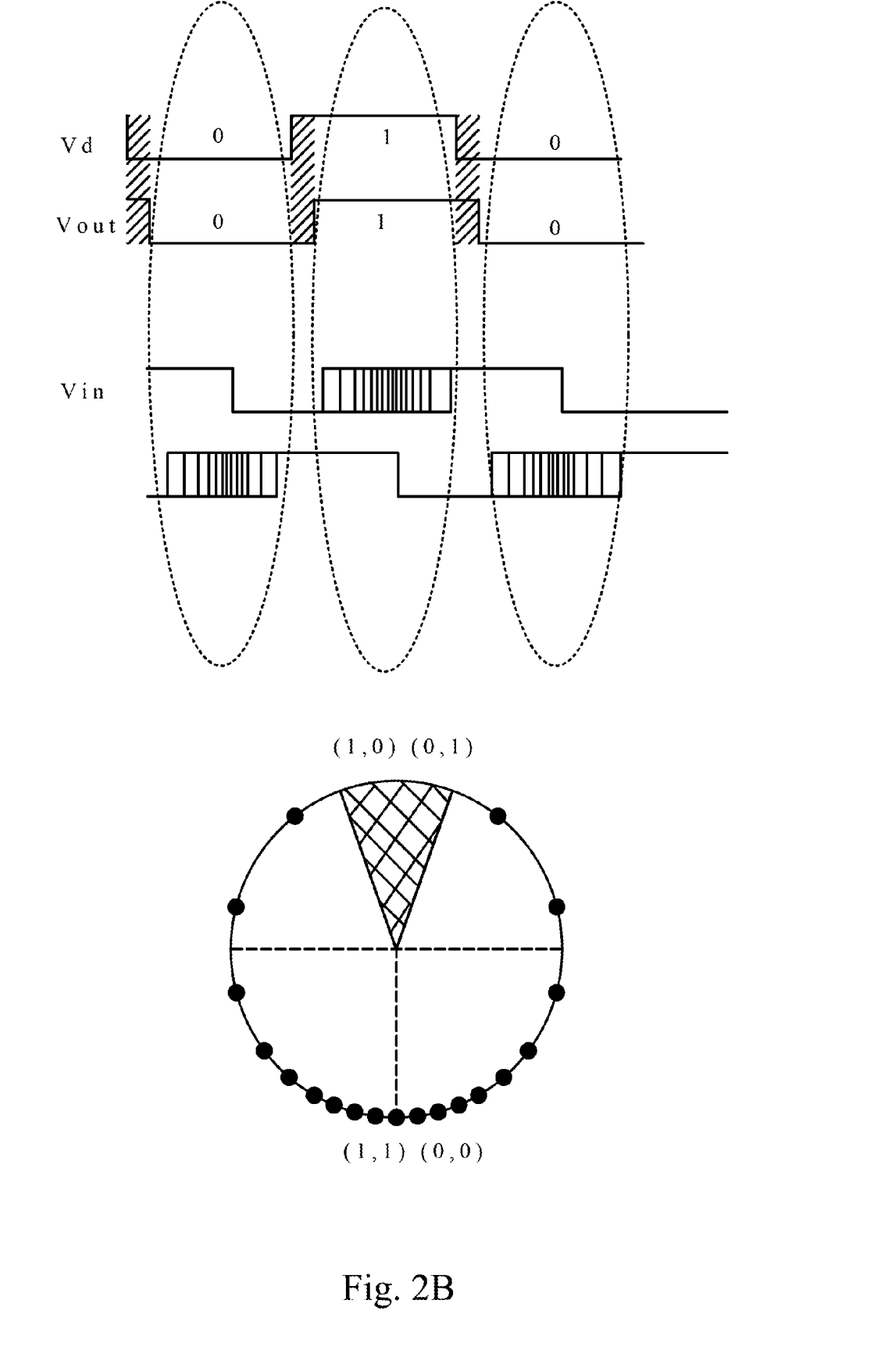
FIG. 2B is a schematic diagram of the detecting principle of the frequency detecting unit in accordance with one embodiments of the present disclosure.
Figure 2C:
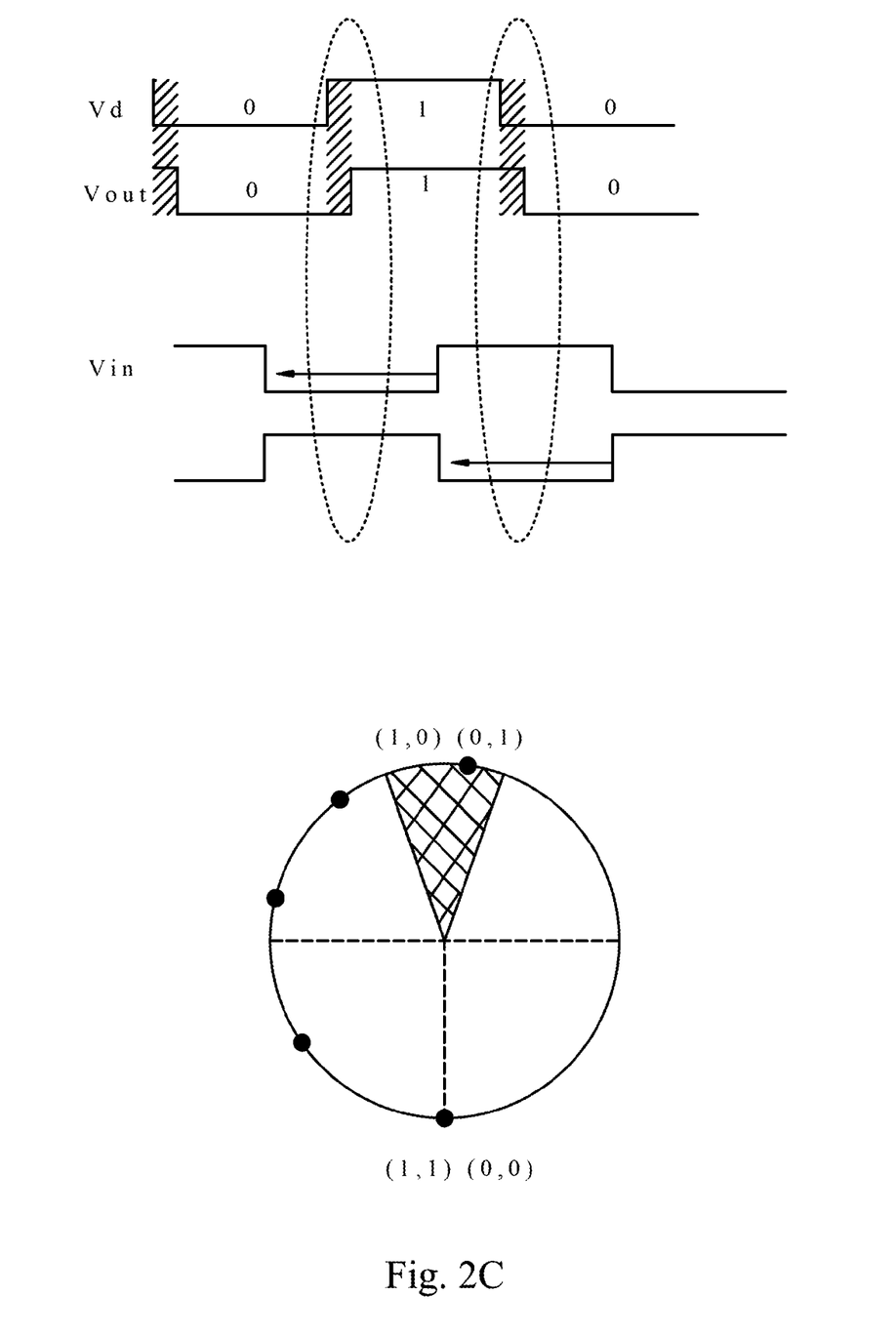
FIG. 2C is a schematic diagram of the detecting principle of the frequency detecting unit in accordance with one embodiments of the present disclosure.
Figure 2D:
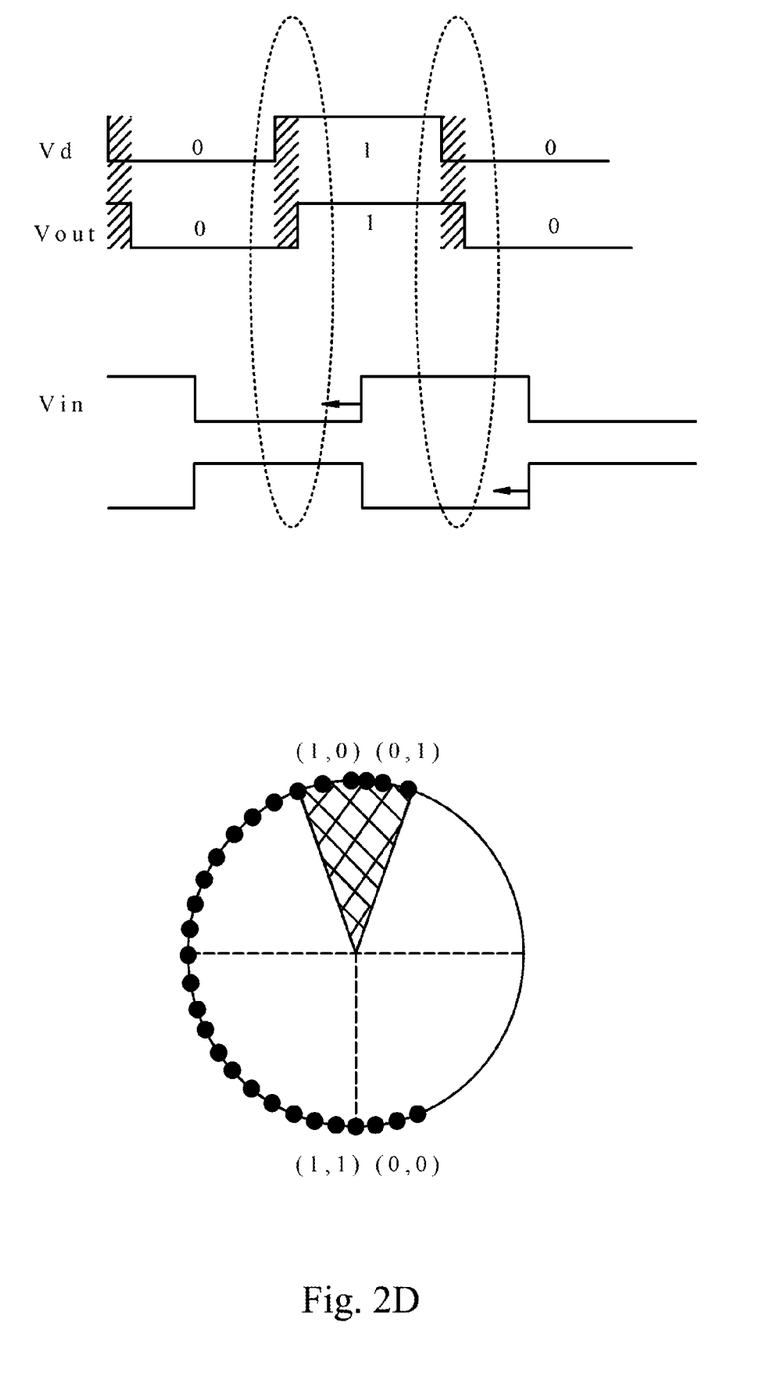
FIG. 2D is a schematic diagram of the detecting principle of the frequency detecting unit in accordance with one embodiments of the present disclosure.
Figure 2E:
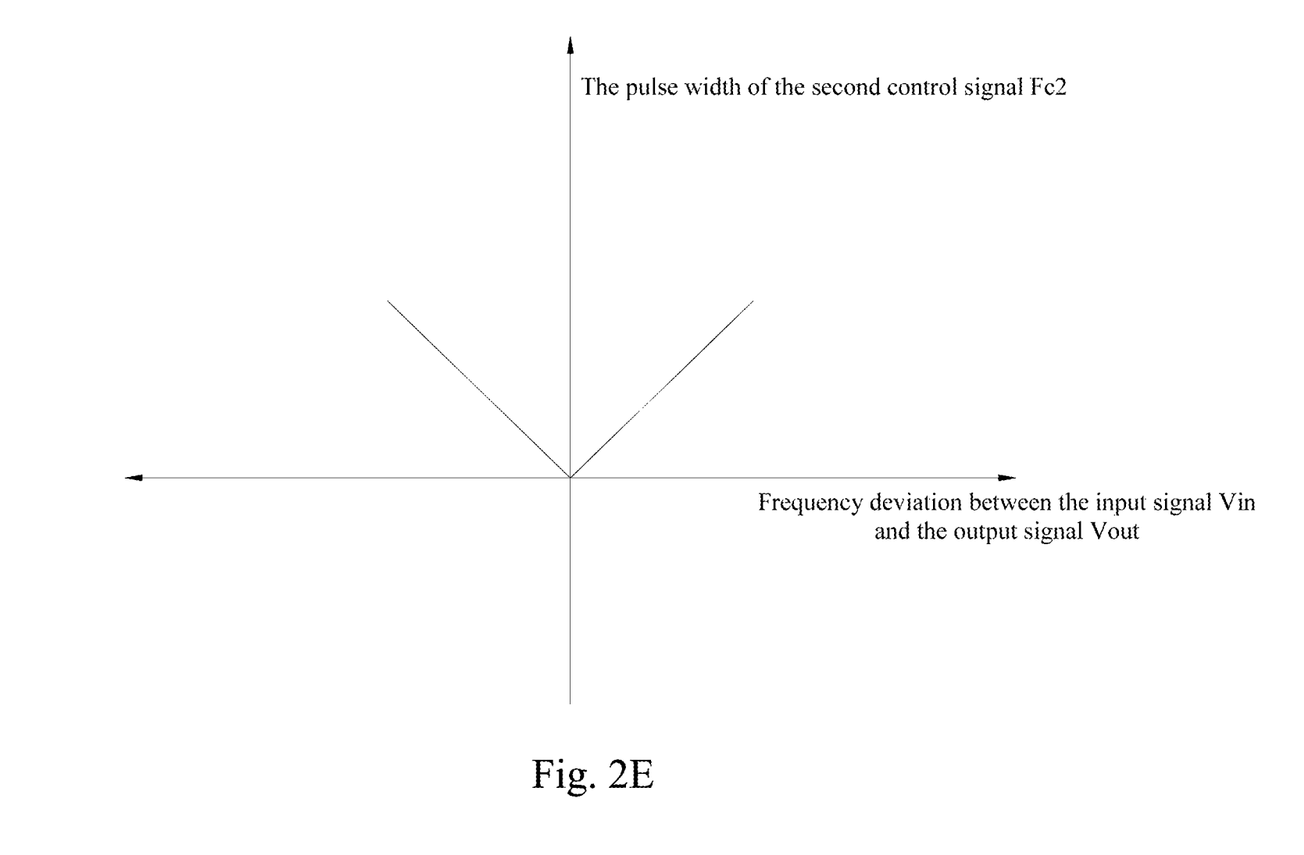
FIG. 2E is a schematic diagram of the transfer function of the second frequency control block in accordance with one embodiment of the present disclosure.

For further explanation, reference is also made to FIG. 2A-2D, FIG. 2A-2D are schematic diagrams of the detecting principle of the frequency detecting unit FD in accordance with embodiments of the present disclosure, and FIG. 2E is a schematic diagram of the transfer function of the second frequency control block in accordance with one embodiment of the present disclosure. As shown in FIG. 2A, there are waveforms of the detect signal Vd, the output signal Vout and the input signal Vin on the upper portion of FIG. 2A. The detect signal Vd is generated to have a phase difference with the output signal Vout, and thus there are out-phase regions between the detect signal Vd and the output signal Vout, which are shown in shaded area. Therefore, if the frequency of the output signal Vout is located or locked at the frequency of the input signal Vin, the rising edges or falling edges of the input signal Vin would be continuously located in in-phase regions between the detect signal Vd and the output signal Vout.

In other words, if coordinate notations (0,0) (0,1) (1,0) (1,1) are utilized to describe locations of the wave edges of the input signal Vin, and the first digit stands for voltage levels of the detect signal Vd, and the second digit stands for voltage levels of the output signal Vout, and thus the rising edges or falling edges of the input signal Vin would be continuously located in (0,0) or (1,1) regions, if the frequency of the output signal Vout is located or locked at the frequency of the input signal Vin.

The relationship between the detect signal Vd, the output signal Vout and the input signal Vin can be further depicted in a circle chart as shown in lower portion of FIG. 2A. It can be seen that, there is also a shaded area in the circle chart corresponding to the out-phase regions between the detect signal Vd and the output signal Vout, such as (1,0) or (0,1) regions. A non-shaded area in the circle chart is corresponding to the in-phase regions between the detect signal Vd and the output signal Vout, such as (1,1) or (0,0) regions. Dots in the circle chart represent the locations of the wave edges of the input signal Vin, and the first digit stands for voltage levels of the detect signal Vd. It should be noted that, in this embodiment, a cycle in the circle chart represents 180° phase angle or one unit interval of the input signal Vin. For further explanation, tracking from location A to location B on the waveforms would sequentially pass through (1,1) (1,0) (0,0) (0,1) regions, and it is equal to tracking two complete cycles on the circle chart, that is to say, the first cycle is tracking from the non-shaded area (representing (1,1)) to the shaded area (representing (1,0)) in the circle chart, and the second cycle is again tracking from the non-shaded area (representing (0,0)) to the shaded area (representing (0,1)) in the circle chart.

In some embodiments, phase locked loop's input signal Vin is a random data stream form a lossy channel in communication system so there may be large jitter existed in the input signal Vin, as shown in FIG. 2B. It can be seen that, even though the wave edges of the input signal Vin are not concentrated but still also spread in the in-phase regions between the detect signal Vd and the output signal Vout, and thus the frequency of the output signal would not be changed and still be located or locked at the frequency of the input signal Vin, and not be affected by the large jitter in the input signal Vin.

On the other hand, if the frequency of the output signal Vout is not located or locked at the frequency of the input signal Vin, some of the rising edges or falling edges of the input signal Vin would be located in out-phase regions between the detect signal Vd and the output signal Vout as shown in FIG. 2C and FIG. 2D. It can be seen that, the difference between FIG. 2C and FIG. 2D is that the density of dots is much higher in FIG. 2D than in FIG. 2C, and it represents that the difference between the frequency of the output signal Vout and the frequency of the input signal Vin is much higher in FIG. 2C than in FIG. 2D. The number of consecutive dots that occur in shaded area is proportional to the time that the input signal Vin stays in shaded area. The time duration that the input signal stays in the shaded area can represent the amount of frequency deviation between the output signal Vout and the input signal Vin. The longer time duration that input signal stays in the shaded area the smaller frequency deviation is. According to the number of consecutive dots occur in shaded area, frequency detecting unit FD can adjust the second control signal Fc2 until no dot occurs in shaded area which means frequency locked. The frequency detecting unit FD transfers the frequency deviation between the output signal Vout and the input signal Vin to the pulse width of the second control signal Fc2 as shown in FIG. 2E. For example, the second frequency control block 132 is configured to receive the output signal Vout and the input signal Vin, and compare the frequency deviation between the output signal Vout and the input signal Vin to generate the second control signal Fc2. The charging/discharging duration for charge pump unit CP2 to charging/discharging the low-pass filter LPF is determined according to the pulse width of the second control signal Fc2, so as to modify the frequency of the output voltage Vout. In other words, the charging/discharging duration is associated with the value of the frequency deviation between the output signal Vout and the input signal Vin. Accordingly, as shown in FIG. 2E, each of the values of the frequency deviation between the output signal Vout and the input signal Vin is transferred to the corresponding pulse width of the second control signal Fc2, and the transfer function of the second frequency control block 132 is symmetric. In other words, different values of the frequency deviation between the output signal Vout and the input signal Vin, which have the same absolute value, are transferred to the same pulse width of the second control signal Fc2. Therefore, under both of the condition, the second control signal Fc2 would be generated by the frequency detecting unit FD for raising up or pulling down the frequency of the output signal Vout. By applying the techniques disclosed in the present disclosure, there is no additional clock signal should be utilized, and thus costs of phase lock circuits can be decreased.

In some embodiments, the frequency detecting unit FD is further configured to control the detect signal Vd for changing the phase difference between the detect signal Vd and the output signal Vout according to the first control signal Fc1. In other words, the detect signal Vd can be generated to have other phase differences with the output signal Vout, and thus make different sizes of shaded area in the out-phase regions or in the circle chart.

Figure 3:
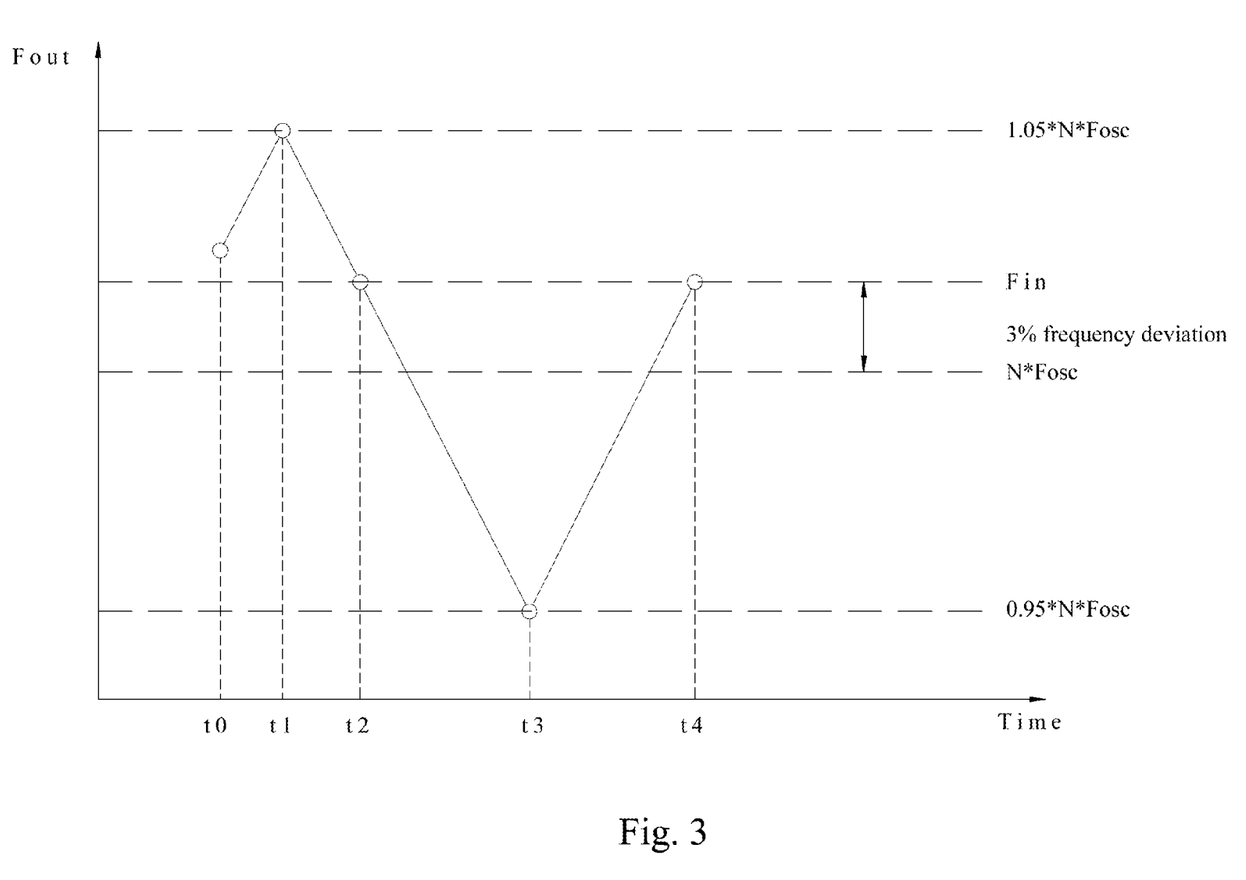
FIG. 3 is a schematic diagram of frequency controlling in accordance with one embodiment of the present disclosure.

For further explanation, Reference is made to FIG. 3, FIG. 3 is a schematic diagram of frequency controlling in accordance with one embodiment of the present disclosure. It can be seen that, the frequency of the output voltage Vout is shown as Fout, and Fosc represents the frequency of the clock signal OSC, and Fin represents the target frequency, and N*Fosc represents the predetermined frequency, and 0.95*N*Fosc~1.05*N*Fosc represents the predetermined frequency region. Initially, at time t0, the frequency of the output voltage Fout is controlled by the first frequency control block 131 to be located within the predetermined frequency region 0.95*N*Fosc~1.05*N*Fosc, and then controlled by the second frequency control block 132 to be located at the target frequency Fin. However, as abovementioned in FIG. 2E, the second frequency control block 132 can only transfer frequency difference to Fc2, which means do not have mechanism to extract correct frequency adjustment direction. Therefore, the first frequency control block 131 is configured to transfer frequency difference to Fc1, which provides mechanism to extract correct frequency adjustment direction. That is to say, there may be a default setting for the pump control unit CPC while receiving the second control signal Fc2 at first time. In this embodiment, let the default setting for the pump control unit CPC be generating the raise-up signal FDUP. Therefore, during time period t0~t1, the frequency of the output voltage Fout is increased to 1.05*N*Fosc, and the first frequency control block 131 generates the first control signal Fc1 to the pump control unit CPC at time t1 in order to prevent the frequency of the output voltage Fout being located outside the predetermined frequency region 0.95*N*Fosc~1.05*N*Fosc, and the pump control unit CPC generates the pull-down signal FDDN. Thus, during time period t1~t2, the frequency detecting unit FD keeps outputting the second control signal Fc2, and the frequency of the output voltage Fout is decreased from 1.05*N*Fosc to Fin. However, it should be noted that, the frequency of the output voltage Fout is supposed to be stopped and located at the target frequency Fin at time t2, but in this embodiment, the detect signal Vd is initially assumed to have big phase differences with the output signal Vout, and thus have big size of shaded area in the out-phase regions or in the circle chart. Therefore, if there is large jitter existed in the input signal Vin as mentioned in FIG. 2B, then there are still some of the wave edges of the input signal Vin located in the out-phase regions would be detected by the frequency detecting unit FD, and the frequency detecting unit FD would not stop outputting the second control signal Fc2. As a result, during time period t2~t3, the frequency of the output voltage Fout is kept decreased from Fin to 0.95*N*Fosc. Similarly, the first frequency control block 131 generates the first control signal Fc1 to the pump control unit CPC at time t3 in order to prevent the frequency of the output voltage Fout from being located outside the predetermined frequency region 0.95*N*Fosc~1.05*N*Fosc, and the pump control unit CPC generates the raise-up signal FDUP. In this embodiment, at time t3, the frequency detecting unit FD is further configured to control the detect signal Vd for changing the phase difference between the detect signal Vd and the output signal Vout according to the first control signal Fc1. In other words, at time t3, the frequency detecting unit FD change the detect signal Vd to obtain smaller phase differences with the output signal Vout, and thus have smaller size of shaded area in the out-phase regions or in the circle chart. Therefore, after time t3, the frequency of the output voltage Fout can not only be increased from 0.95*N*Fosc to Fin, but also be stably located at the target frequency Fin after time t3 and before time t4. Thus, in some embodiments, controlling the frequency detecting unit effectively prevents the jitters of the input signal from affecting the operation of the phase locked loop circuit.

In some embodiments, the second frequency control block 132 further comprises a turn-off control unit OFF, while the frequency of the output signal Vout is located at the target frequency, the frequency detecting unit FD is further configured to generate at least one stop signal to the turn-off control unit OFF, and the turn-off control unit OFF is configured to count consecutive counts of the at least one stop signal, while the consecutive counts of the at least one stop signal is bigger than a predetermined count, the turn-off control unit OFF turns off the frequency detecting unit FD. That is to say, if the frequency of the output voltage Fout is stably located or locked at the frequency of the input voltage Vin, it is no need for the frequency detecting unit FD to keep active and make the energy loss. Therefore, in this embodiment, if the frequency of the output voltage Fout is stably located or locked at the frequency of the input voltage Vin, the frequency detecting unit FD can transmit at least one stop signal to the turn-off control unit OFF. While the consecutive counts of the at least one stop signal (such as 6 consecutive counts) is bigger than a predetermined count (such as 5), the turn-off control unit OFF can turn off the frequency detecting unit FD. In some embodiments, the turn-off control unit OFF turns on the frequency detecting unit FD according to a reset signal. In some practical apparitions, after the frequency detecting unit FD is turned off, it can be restarted by the reset signal. Thus, in some embodiments, the frequency detecting unit can be turned off to reduce the power consumption.

Figure 4:
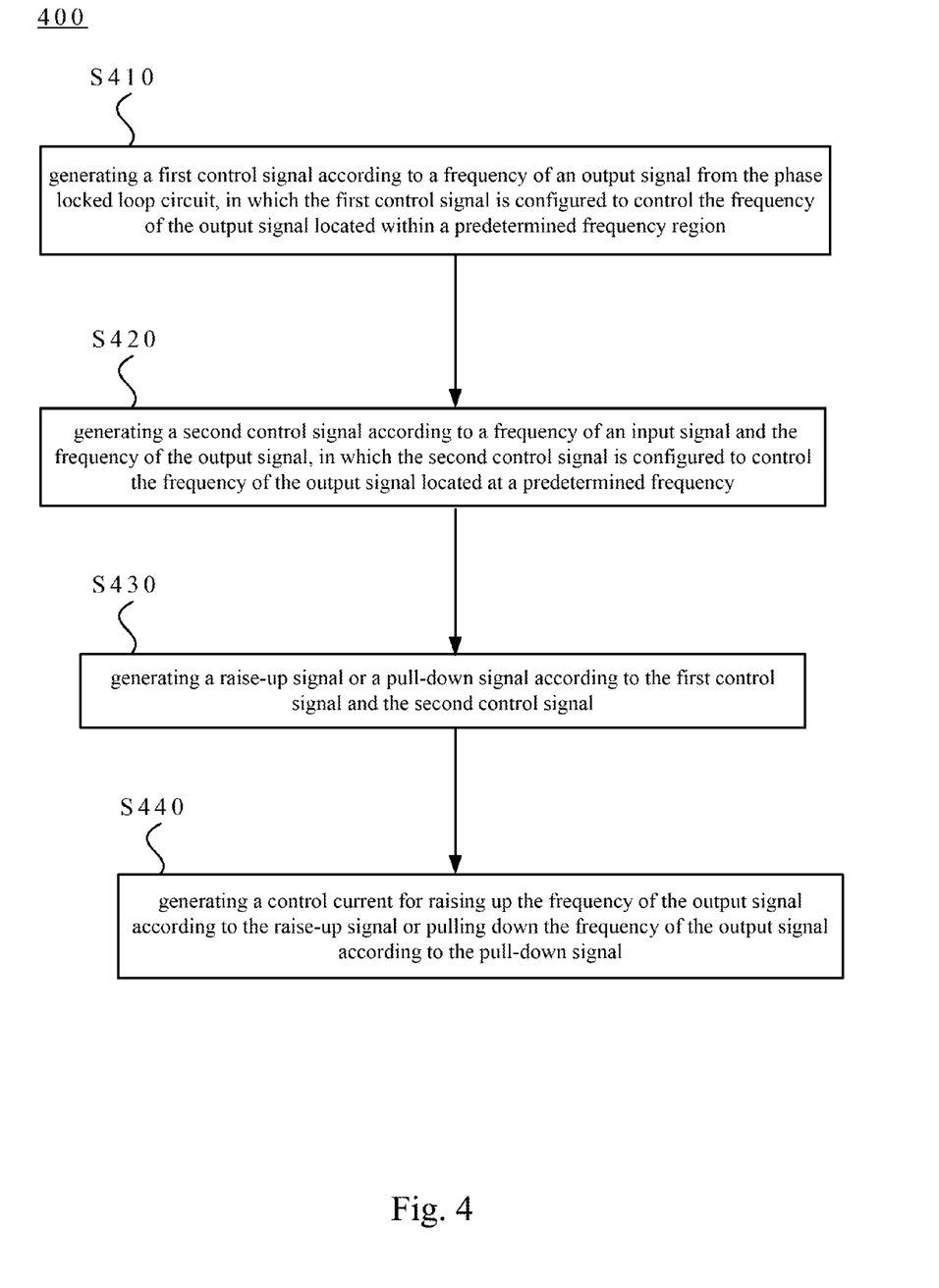
FIG. 4 is a flow chart of a frequency control method in accordance with one embodiment of the present disclosure.

Reference is now made to FIG. 4. FIG. 4 is a flow chart of a frequency control method 400 in accordance with one embodiment of the present disclosure. The frequency control method 400 may be implemented by the frequency control circuit 130 illustrated in FIG. 1, but is not limited in this regard. For convenience and clarity, it is assumed that the frequency control method 400 is implemented by the frequency control circuit 130 illustrated in FIG. 1.

The frequency control method 400 first conducts step 410, generating a first control signal according to a frequency of an output signal from the phase locked loop circuit, in which the first control signal is configured to control the frequency of the output signal located within a predetermined frequency region.

Then the frequency control method 400 conducts step 420, generating a second control signal according to a frequency of an input signal and the frequency of the output signal, in which the second control signal is configured to control the frequency of the output signal located at a target frequency. In one embodiment, the frequency control method 400 conducts the step 410 and the step 420 simultaneously, generating the first control signal and the second control signal according to the frequency of the input signal and the frequency of the output signal.

Then the frequency control method 400 conducts step 430, generating a raise-up signal or a pull-down signal according to the first control signal and the second control signal.

Then the frequency control method 400 conducts step 440, generating a control current for raising up the frequency of the output signal according to the raise-up signal or pulling down the frequency of the output signal according to the pull-down signal. By applying the techniques disclosed in the present disclosure, there is no additional clock signal should be utilized, and thus costs of phase lock circuits can be decreased.

The above illustrations include exemplary operations, but the operations are not necessarily performed in the order shown. Operations may be added, replaced, changed order, and/or eliminated as appropriate, in accordance with the spirit and scope of various embodiments of the present disclosure.

By applying the techniques disclosed in the present disclosure, there is no additional high accuracy clock signal should be utilized, and thus costs of phase lock circuits can be decreased. In addition, in some embodiments, controlling the frequency detecting unit effectively prevents the jitters of the input signal from affecting the operation of the phase locked loop circuit, or in some embodiments, the frequency detecting unit can be turned off to reduce the power consumption.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A frequency control circuit, adapted to be utilized in a phase locked loop circuit, the frequency control circuit comprises:
 a first frequency control block, configured to generate a first control signal according to a frequency of an output signal from the phase locked loop circuit, wherein the first control signal is configured to control the frequency of the output signal located within a predetermined frequency region, wherein the first frequency control block comprises:
  a clock generating unit, configured to generate a clock signal;
  a frequency dividing unit, configured to divide the frequency of the output signal by a factor to generate a frequency-divided signal; and
  a rotating unit, electrically coupled with the frequency dividing unit and the clock generating unit, the rotating unit being configured to generate the first control signal while a difference between a frequency of the frequency-divided signal and a frequency of the clock signal is bigger than a predetermined value corresponding to the predetermined frequency region;
 a second frequency control block, configured to generate a second control signal according to a frequency of an input signal and the frequency of the output signal, wherein the second control: signal is configured to control the frequency of the output signal located at a target frequency;
 a pump control unit, electrically coupled with the first frequency control block and the second frequency control block, the pump control unit being configured to generate a raise-up signal or a pull-down signal according to the first control signal and the second control signal; and
 a charge pump unit, electrically coupled with the pump control unit, the charge pump unit being configured to generate a control current for raising up the frequency of the output signal according to the raise-up signal or piling down the frequency of the output signal according to the pull-down signal.

2. The frequency control circuit of claim 1, wherein the second frequency control block comprises:
 a frequency detecting unit, configured to generate a detect signal according to the frequency of the output signal, and extract the amount of frequency deviation between the output signal and the input signal from the time duration of the input signal consecutive dots located in out-phase regions.

3. The frequency control circuit of claim 2, wherein the second frequency control block further comprises a turn-off control unit, while the frequency of the output signal is located at the target frequency, the frequency detecting unit is further configured to generate at least one stop signal to the turn-off control unit, and the turn-off control unit is configured to count consecutive counts of the at least one stop signal, while the consecutive counts of the at least one stop signal is bigger than a predetermined count, the turn-off control unit turns off the frequency detecting unit.

4. The frequency control circuit of claim 3, wherein the tutu-off control unit turns on the frequency detecting unit according to a reset signal.

5. The frequency control circuit of claim 2, wherein the frequency detecting unit is further configured to control the detect signal for changing a phase difference between the detect signal and the output signal according to the first control signal.

6. A frequency control method, adapted to be utilized in a phase locked loop circuit, the frequency control method comprises:
 generating a first control signal according to a frequency of an output signal from the phase locked loop circuit, wherein the first control signal is configured to control the frequency of the output signal located within a predetermined frequency region, wherein generating the first control signal comprises:
  generating a clock signal;
  dividing the frequency of the output signal by a factor to generate a frequency-divided signal; and
  generating the first control signal while a difference between a frequency of the frequency-divided signal and a frequency of the clock signal is bigger than a predetermined value corresponding to the predetermined frequency region;
 generating a second control signal according to a frequency of an input signal and the frequency of the output signal, wherein the second control signal is configured to control the frequency of the output signal located at a target frequency;
 generating a raise-up signal or a pull-down signal according to the first control signal and the second control signal; and
 generating a control current for raising up the frequency of the output signal according to the raise-up signal or pulling down the frequency of the output signal according to the pull-down signal.

7. The frequency control method of claim 6, wherein generating the second control signal comprises:
 generating a detect signal according to the frequency of the output signal; and
 extracting the amount of frequency deviation between the output signal and the input signal from the time duration of the input signal consecutive dots located in out-phase regions.

8. The frequency control method of claim 7, further comprising:
 generating at least one stop signal while the frequency of the output signal is located at the target frequency;
 counting consecutive counts of the at least one stop signal; and
 generating, a turn-off signal while the consecutive counts of the at least one stop signal is bigger than a predetermined count.

9. The frequency control method of claim 7, further comprising:
 controlling the detect signal for changing a phase difference between the detect signal and the output signal according to the first control signal.

10. A phase locked loop circuit, comprising:
 a voltage-controlled oscillator, configured to generate an output signal;
 a phase control circuit, electrically coupled with the voltage-controlled oscillator, configured to generate a first control current according to a phase of an input signal and a phase of the output signal;
 a frequency control circuit, electrically coupled with the voltage-controlled oscillator, configured to generate a second control current according to a frequency of the input signal and the frequency of the output signal, wherein the frequency control circuit comprises:

a first frequency control block, configured to generate a first control signal according to the frequency of the output signal, wherein the first control signal is configured to control the frequency of the output signal located within a predetermined frequency region, wherein the first frequency control block comprises:
  a clock generating unit, configured to generate a clock signal;
  a frequency dividing unit, configured to divide the frequency of the output signal by a factor to generate a frequency-divided signal; and
  a rotating unit, electrically coupled with the frequency dividing unit and the clock generating unit, the rotating unit being configured to generate the first control signal while a difference between a frequency of the frequency-divided signal and a frequency of the clock signal is bigger than a predetermined value corresponding to the predetermined frequency region;
a second frequency control block, configured to generate a second control signal according to the frequency of the input signal and the frequency of the output signal, wherein the second control signal is configured to control the frequency of the output signal located at a target frequency;
a pump control unit, electrically coupled with the first frequency control block and the second frequency control block, the pump control unit being configured to generate a raise-up signal or a pull-down signal according to the first control signal and the second control signal; and
a charge pump unit, electrically coupled with the pump control unit, the charge pump unit being configured to generate the second control current for raising up the frequency of the output signal according to the raise-up signal or pulling down the frequency of the output signal according to the pull-down signal.

11. The phase locked loop circuit of claim 10, wherein the second frequency control block comprises:
  a frequency detecting unit, configured to generate a detect signal according to the frequency of the output signal, and extract the amount of frequency deviation between the output signal and the input signal from the time duration of the input signal consecutive dots located in out-phase regions.

12. The phase locked loop circuit of claim 11, wherein the second frequency control block further comprises a turn-off control unit, while the frequency of the output signal is located at the target frequency, the frequency detecting unit is further configured to generate at least one stop signal to the turn-off control unit, and the turn-off control unit is configured to count consecutive counts of the at least one stop signal, while the consecutive counts of the at least one stop signal is bigger than a predetermined count, the turn-off control unit turns off the frequency detecting unit.

13. The phase locked loop circuit of claim 12, wherein the turn-off control unit turns on the frequency detecting unit according to a reset signal.

14. The phase locked loop circuit of claim 11, wherein the frequency detecting unit is further configured to control the detect signal for changing a phase difference between the detect signal and the output signal according to the first control signal.

* * * * *